United States Patent [19]

Jacobs et al.

[11] Patent Number: 4,853,320
[45] Date of Patent: Aug. 1, 1989

[54] METHOD OF LOCALLY PROVIDING METAL ON A SURFACE OF A SUBSTRATE

[75] Inventors: Johannes W. M. Jacobs; Johannes M. G. Rikken, both of Eindhoven, Netherlands

[73] Assignee: U.S. Philips Corporation, New York, N.Y.

[21] Appl. No.: 116,413

[22] Filed: Nov. 2, 1987

[30] Foreign Application Priority Data

Sep. 16, 1987 [NL] Netherlands ............... 8702219

[51] Int. Cl.$^4$ .................................... G03F 7/00
[52] U.S. Cl. ........................... 430/413; 430/414; 430/417; 430/422; 427/98; 427/443.1; 427/437
[58] Field of Search ............ 430/413, 417, 422, 414; 427/98, 443.1, 437; 204/130; 106/1.25

[56] References Cited

U.S. PATENT DOCUMENTS

| | | | |
|---|---|---|---|
| 2,938,805 | 5/1960 | Agens | 106/1.26 |
| 3,300,335 | 1/1967 | Horvath | 106/1.25 |
| 3,454,416 | 7/1969 | Heymann | 427/437 |
| 3,666,527 | 5/1972 | Feldstein et al. | 427/98 |
| 3,900,599 | 8/1975 | Feldstein | 427/97 |
| 4,133,908 | 1/1979 | Madsen | 430/413 |
| 4,152,467 | 5/1979 | Alpaugh et al. | 427/98 |
| 4,192,764 | 3/1980 | Madsen | 430/413 |
| 4,426,442 | 1/1984 | Molenaar et al. | 430/413 |
| 4,550,036 | 10/1985 | Ludwig et al. | 427/125 |
| 4,579,804 | 4/1986 | Takeuchi et al. | 430/413 |
| 4,684,545 | 8/1987 | Fey et al. | 427/98 |

Primary Examiner—Paul R. Michl
Assistant Examiner—Patrick A. Doody
Attorney, Agent, or Firm—Norman N. Spain

[57] ABSTRACT

A method of locally providing metal on a surface of a substrate, in which the substrate is provided at the surface with an electrocatalythic image. The surface is then brought into contact with an electroless metal-plating solution. The electrocatalythic image is capable of binding metal to it from the metal-plating solution. Due to the fact that the image is brought into contact with the metal-plating solutin, the image is gradually strengthened with metal from the solution. With images smaller than 10 μm, this strengthening is prevented, however, due to the fact that oxygen is present in the solution. Because oxygen is reduced, a reduction of metal ions in the solution cannot occur, as a result of which no metal deposition takes place on the image. According to the invention, the reduction of oxygen in the solution is counteracted at least relatively so that also in the case of images smaller than 10 μm metal ions are reduced without hindrance to the metal, which is then deposited on the image. This images smaller than 10 μm can be strengthened too.

7 Claims, No Drawings

METHOD OF LOCALLY PROVIDING METAL ON A SURFACE OF A SUBSTRATE

The invention relates to a method of locally providing metal on a surface of a substrate, in which the substrate is provided at the surface with an electrocatalytic image, which is brought into contact with an electroless metal-plating solution and is strengthened by an electroless method. An electrocatalytic image is to be understood in this connection to mean a part of the substrate surface, which is capable of separate metal out of the metal-plating solution when the surface is brought into contact with said solution.

The image can be provided in many ways. For example, it is possible to locally provide an electrocatalytic compound on the surface, but it is also possible to convert the substrate at its surface locally in such a manner that it locally obtains an electrocatalytic effect. In the case of a substrate of silicon, this can e.g. be achieved by local silicidation with a suitable metal. It is further possible to provide the image in that a substrate, which is electrocatalytic throughout its whole surface, is locally covered with a masking layer.

During the manufacture of micro-electronic circuits, masks are used which generally comprise a transparent substrate, on which an opaque patterned metal layer is provided. During the manufacture of such photolithographic masks, however, defects may occur in the metal layer. These defects can be distinguished into transparent and non-transparent defects and provided for a high rejection percentage of manufactured masks. A transparent effect is meant if at a given area a part of the metal layer fails. Non-transparent effects are meant if at a given area metal is present on the substrate, while it should not be present there. The method of the kind mentioned in the opening paragraph is particularly suitable for restoring transparent defects in photolithographic masks.

The invention is further also suitable, for example, to provide metal wiring on a semiconductor device and to fill contact holes with metal for forming, for example, interconnections in a multilayer metallization.

A method of the kind mentioned in the opening paragraph is known U.S. Pat. No. 4,426,442. In the method described therein, the surface is provided with the image by locally forming on the surface of the substrate an electrocatalythic compound. For this purpose, the substrate is provided at its surface with a photosensitive compound, for example titanium oxide or zinc oxide, which after exposure is capable of separating out of a solution of metal ions this metal in the form of nuclei. Subsequently, the surface is provided with the electrocatalythic image in that it is immersed in a solution of metal ions, such as, for example, copper and gold ions, and is exposed according to a given pattern with a focused laser beam. As a result, the photosensitive compound is activated according to a given pattern and the metal ions are deposited on the surface in the form of metal nuclei. The metal nuclei are then intensified by an electroless method, in which the surface is brought into contact with an electroless metal-plating solution. In a given case, the metal-plating solution can also be used to deposit therefrom the metal nuclei. For example, for the whole treatment a solution may be used which comprises potassium gold (I) cyanide, copper sulphate tetra-Na-salt of ethylene diamino-tetra-acetic acid, sodium hydroxide and formaldehyde.

It has been found that the known method is not satisfactory for depositing metal images having a size smaller than 10 $\mu$m on a substrate. However, during the manufacture of semiconductor circuits, nowadays masks are used in which transparent defects having a diameter of a few micrometres are already inadmissible. In general, in the semiconductor technology there is a need to provide submicron metal images. It stands to reason that with the gradually advancing miniaturization of semiconductor circuit elements this need merely increases.

The invention has inter alia for its object to provide a method by which it is possible to provide on the substrate surface metal images which are smaller than 10 $\mu$m.

In order to achieve the object aimed at, according to the invention the method of the kind mentioned in the opening paragraph is characterized in that the surface is brought into contact with an electroless metal-plating solution in which a reduction of oxygen is counteracted at least relatively.

An electroless metal-plating solution is generally a solution of a metal salt and a reduction agent. In order to oxidize the reduction agent, a given activation energy must be overcome. The electrocatalythic surface makes it possible to achieve this. If this activation energy is very low, the term "physical developer" is also used instead of the term "electroless metal-plating solution". However, within the scope of the invention, this distinction is not made so that in the present Application the term "an electroless metal-plating solution" is also to be understood to mean a physical developer.

If the reduction agent is oxidized, electrons are released. These electrons in turn reduce metal ions from the solution to the metal, which is then deposited. The oxidation of the reduction agent does not occur spontaneously, however. It only takes place at a surface electrocatalytic for the reduction agent. If the substrate is immersed in the metal-plating solution, the metal is therefore deposited on the substrate surface only at the area at which it is provided with the electrocatalythic image. Thus, this image is intensified with the metal from the metal-plating solution.

If, however, oxygen is present in the metal-plating solution, a competitive reaction occurs. The oxygen present in the solution is in fact reduced much more readily by the electrons than the metal ions so that, if both are present, only or substantially only a reduction of oxygen occurs.

With larger images, this competitive reduction of oxygen does not play such an important part because the catalythic surface is sufficiently large and thus the number of generated electrons is also sufficiently large to deplete the oxygen present in the proximity of this surface. A sufficient number of electrons is then still left for the reduction of the metal ions.

However, with smaller images, the situation is different. In the first place, a correspondingly smaller number of electrons is generated, but moreover the aforementioned competition of oxygen is relatively much larger.

If oxygen is reduced, the oxygen concentration in the proximity of the image consequently decreases. As a result, diffusion of oxygen from farther remote parts of the solution to the image will occur. The diffusion flow density of oxygen to the image is in inverse proportion to the size of the surface of the image. This means that with small metal images a comparatively large quantity of oxygen is present. The already small number of generated electrons is therefore insufficient with small metal images to fully reduce the large quantity of oxygen. All the generated electrons are consumed by the oxygen present and a reduction of metal ions cannot or substantially cannot occur. It is therefore not possible to provide metal images by the known method if the size of the metal images lies below a given value. Experiments have shown that this value amounts to approximately 10 μm.

If however, in the metal-plating solution according to the invention the reduction of oxygen is counteracted, substantially all the electrons generated by the reduction agent can be used for the reduction of the metal ions. Irrespective of the size of the electrocatalythic image, there is a sufficient number of electrons available to reduce metal ions to the metal, which is then deposited at the area of the image. In practice, electrocatalythic images having a diameter of 1 μm and smaller are thus successfully intensified.

The reduction of oxygen can be counteracted by expelling the oxygen from the metal-plating solution. According to an embodiment of the invention, this is effected by passing an inert gas is passed through the solution. In the solution only a limited quantity of gas can be dissolved. When the inert gas is passed through the solution, the solution becomes saturated therewith so that no place is left any more for oxygen.

According to another embodiment of the method, the reduction of oxygen is counteracted at least relatively in that the electroless intensification of the nuclei is carried out at elevated temperature. Ihe effect of this measure is bilateral: in the first place, with increasing temperature a smaller quantity of gas can be dissolved in the solution. By increasing the temperature, oxygen is thus expelled from the solution. However, in the second place, the oxidation of the reduction agent present in the solution is effected much more rapidly as the temperature increases. The speed of oxidation increases exponentially with an increase of temperature. As a result, a considerably larger number of electrons are generated at an elevated temperature than at a reduced temperature. Ihis number is amply sufficient at elevated temperature to deplete the oxygen present so that also metal ions can be reduced to the metal, which is then deposited on the nuclei. The reduction of oxygen will also be effected more rapidly, it is true, but because the speed of reduction depends considerably less strongly upon temperature and because, as stated, less oxygen is dissolved in the solution at elevated temperature, the reduction is nevertheless counteracted relatively by increasing the temperature.

A particular embodiment of the method is characterized in that the reduction of oxygen is counteracted in that the metal-plating solution is formulated so that the reduction of oxygen substantially does not occur. It has been found, for example, that the reduction of oxygen in a nickel-containing metal-plating solution strongly depends upon the degree of acidity of the solution. The reduction is found to occur satisfactorily only in an alkaline atmosphere. The reduction is therefore strongly counteracted by acidifying the metal-plating solution. Ihe oxidation of the reduction agent and the reduction of the metal ions are not adversely affected by the acid atmosphere, however.

A further embodiment of the method according to the invention is characterized in that the metal-plating solution is provided on the surface in the form of a thin film. As stated, the deposition of small metal images is rendered difficult especially by the comparatively large diffusion current of oxygen to such small metal images. Normally speaking, the metal image is surrounded by a spherical diffusion field, within which diffusion to the image occurs. With a small metal image, this diffusion field is considerably larger than the image itself. When the solution in the form of a thin film is brought into contact with the surface, this diffusion field is flattened. This may be effected, for example, in that the solution is provided on the surface in the form of a drop and is then covered by a covering glass, foil or film, as a result of which the drop is depressed to a thin film. Consequently, the diffusion field is strongly reduced, as a result of which the diffusion of oxygen is strongly reduced. The diffusion of the reduction agent and the metal ions is of course also reduced by this measure, but because both are present in the solution in a considerably concentration, than oxygen: they are not hindered thereby.

The invention will now be described with reference to a few examples. In all these examples, the starting material is a quartz substrate covered at its surface by a photosensitive titanium oxide layer.

EXAMPLE I

The substrate is immersed in a palladium chloride solution of about $5.6.10^{-3}$ M $PdCl_1$, $1.2.10^{-1}$ M HCl and 0.4% by weight of Tensagex DP-24. The photosensitive titanium oxide layer is then exposed with a focused laser beam, as a result of which palladium is deposited in the form of nuclei on the surface only at the area of the laser spot. These palladium nuclei form the electrocatalythic image, which is strengthened in accordance with the invention by an electroless method. The size of the electrocatalythic image is thus determined by the diameter of the laser spot. For example, an exposure for 4 seconds with a beam focused to a spot of 10 μm originating from an A+UV laser having a power of 5 mW results in an electrocatalythic image of palladium nuclei having a diameter of 8 μm. Thus, electrocatalythic images having a diameter varying from about 0.5 μm to 40 μm are provided on the substrate.

After the substrate has been thoroughly rinsed with demineralized water, it is immersed in an electroless metal-plating solution, which contains per liter about 30 g of $NiCl_2.6H_2O$, 10 g of $NaH_2PO_2.H_2O$ and 30 g of glycin. The palladium nuclei are for this solution electrocatalythic. After about 15 minutes, the substrate is taken from the solution, is rinsed with demineralized water and is analysed under a microscope. It has been found that the electrocatalythic images having a diameter of 25 μm were considerably intensified with nickel, but that the smaller images did not exhibit any nickel deposition at all.

EXAMPLE II

In this example, a substrate is treated in the same manner as in the preceding embodiment. However nitrogen gas is passed through the solution for a few hours in order to expel oxygen therefrom before the substrate is immersed in the metal-plating solution. In order to avoid that oxygen from the ambient air penetrates again into the solution, the whole treatment is carried out in a closed system. After analysis of the substrate, it has been found that nickel has been deposited not only on electrocatalythic images having a diameter of 25 μm and larger, but also on images having a diameter between 1 μm and 25 μm.

EXAMPLE III

Two similar substrates are provided in the same manner as in the preceding examples with electrocatalythic images of palladium nuclei. Subsequently, both substrates are immersed separately in a metal-plating solution commercially available: Niposit 468, marketed by Shipley. A first substrate is immersed in a solution held by means of a thermostat at the indicated temperature of 65° C., while the solution of the other substrate is held at a temperature of about 85° C. After about 15 minutes, the substrates are taken from the solution and are thoroughly rinsed with demineralized water. Under the microscope, it has been found that with the first substrate nickel has been deposited only on images having a diameter of 20 μm and larger, while with the other substrate images having a diameter of 4 μm and larger have been intensified with nickel.

EXAMPLE IV

After a substrate has been provided with electrocatalythic images in the manner described in the first example, it is immersed in a metal-plating solution of 0.025M N-methyl-p-aminophenol, 0.01M $AgNO_3$ and 0.1M citric acid. This solution has a degree of acidity which is about pH=2.1 and is composed so that a reduction of oxygen cannot or substantially cannot occur therein. After about 15 minutes, the substrate is removed from the solution and is thoroughly rinsed with demineralized water. After analysis, it has been found that all the images of palladium nuclei have been intensified with silver.

It should be noted here that the invention is not limited to the examples described herein, but may be used in numerous other embodiments. For example, instead of titanium oxide, zinc oxide may also be used for the photosensitive layer. Besides, instead of palladium nuclei, nuclei of most of the other metals may also be deposited in an analogous manner on the photosensitive layer to form therewith an electrocatalythic image.

Moreover, it is possible to provide in a quite different manner an electrocatalythio image on a substrate surface. A few examples thereof have been mentioned herein before.

Further, there is a wide choice with respect to the electroless metal-plating solution. Instead of a metal-plating solution for electroless deposition of nickel or silver, for example, use may also be made of a solution for the deposition of copper or gold. In the former case, use may then be made of a solution containing per liter 10 g of $CuSO_4.5H_2O$, 50 g of Rochelle salt, 10 g of NaOH and 25 ml of (27%) formaldehyde or of a solution containing per liter 10 g of $CuSO_4.5H_2O$, 32.6 g of $Na_4EDTA.4H_2O$, 4.8 g of NaOH and 7.5 ml of (37%) formaldehyde. For the deposition of gold, a solution may be used containing per liter 1.44 g of $KAu(CN)_2$, 6.5 g of KCN, 8 g of NaOH and 10.8 g of $KBH_4$.

What is claimed is:

1. A method of locally providing a metal image of dimensions less than 10 μm on the surface of a substrate, in which method the substrate is provided at its surface with an electrocatalytic image, which image is brought into contact with an electroless metal-plating solution containing a metal salt and a reducing agent capable of reducing the metal ions of said metal salt to metal thereby causing metal to be deposited from said solution onto said electrocatalystic image to thereby intensify said image characterized in that reduction of oxygen in said soltution by said reducing agent is counteracted at least relative to the reduction of the metal ions of the metal salt by said reducing agent.

2. A method as claimed in claim 1, characterized in that the reduction of oxygen is counteracted by expelling oxygen from the metal-plating solution.

3. A method as claimed in claim 2, characterized in that oxygen is expelled from the solution by passing an inert gas through the metal-plating solution.

4. A method as claimed in claim 1, characterized in that the reduction of oxygen is counteracted by bringing the electroless metal-plating solution into contact with the electrocatalytic image at an elevated temperature.

5. A method as claimed in claim 1, characterized in that the reduction of oxygen is counteracted by formulating the metal-plating solution so that the reduction of oxygen substantially does not occur.

6. A method as claimed in claim 5, characterized that the metal-plating solution is formulated so that it is acidic.

7. A method as claimed in claim 1 characterized in that the metal plating solution is provided on the surface in the form of a thin film.

* * * * *